US007895855B2

(12) United States Patent
Gooch

(10) Patent No.: US 7,895,855 B2
(45) Date of Patent: Mar. 1, 2011

(54) CLOSED DATA CENTER CONTAINMENT SYSTEM AND ASSOCIATED METHODS

(75) Inventor: Rodger J Gooch, Tampa, FL (US)

(73) Assignee: Liebert Corporation, Columbus, OH (US)

( * ) Notice: Subject to any disclaimer, the term of this patent is extended or adjusted under 35 U.S.C. 154(b) by 1 day.

(21) Appl. No.: 12/434,230

(22) Filed: May 1, 2009

(65) Prior Publication Data

US 2009/0216381 A1 Aug. 27, 2009

Related U.S. Application Data

(60) Provisional application No. 61/049,847, filed on May 2, 2008.

(51) Int. Cl.

| | |
|---|---|
| ***F25D 23/12*** | (2006.01) |
| ***F28F 7/00*** | (2006.01) |
| ***H05K 7/20*** | (2006.01) |
| ***H05K 5/00*** | (2006.01) |
| ***G01M 1/38*** | (2006.01) |

(52) U.S. Cl. ..................... 62/259.2; 165/80.3; 361/695; 361/724; 700/277; 454/184

(58) Field of Classification Search ................ 62/259.2, 62/89; 165/80.3; 361/694, 695, 696, 687, 361/724; 236/1 R; 700/277, 276, 278; 454/184
See application file for complete search history.

(56) References Cited

U.S. PATENT DOCUMENTS

| | | | | |
|---|---|---|---|---|
| 4,271,678 | A * | 6/1981 | Liebert | 62/173 |
| 5,747,734 | A | 5/1998 | Koslowski et al. | |
| 5,906,315 | A * | 5/1999 | Lewis et al. | 236/49.3 |
| 5,934,368 | A * | 8/1999 | Tanaka et al. | 165/233 |
| 6,026,891 | A | 2/2000 | Fujiyoshi et al. | |
| 6,104,003 | A | 8/2000 | Jones | |
| 6,317,053 | B1 | 11/2001 | Seeliger et al. | |
| 6,412,292 | B2 | 7/2002 | Spinazzola et al. | |
| 6,494,050 | B2 * | 12/2002 | Spinazzola et al. | 62/89 |
| 6,506,111 | B2 | 1/2003 | Sharp et al. | |
| 6,535,382 | B2 * | 3/2003 | Bishop et al. | 361/690 |
| 6,548,753 | B1 | 4/2003 | Blackmon, Jr. et al. | |
| 6,557,357 | B2 | 5/2003 | Spinazzola et al. | |
| 6,574,970 | B2 | 6/2003 | Spinazzola et al. | |

(Continued)

FOREIGN PATENT DOCUMENTS

| | | |
|---|---|---|
| EP | 1662851 | 9/2008 |

*Primary Examiner*—Chen-Wen Jiang
(74) *Attorney, Agent, or Firm*—Harness, Dickey & Pierce, P.L.C.

(57) ABSTRACT

A containment system includes a control unit comprising a cooling system and a control panel in communication with the cooling system. The containment system also includes a containment unit in communication with the control unit for containing a plurality of electronic components. The containment unit includes a base including a damper, a plurality of sidewalls extending upwardly from the base, and a top overlying the base and having a passageway formed area. The base, the plurality of sidewalls and the top define a containment area there between for containing the plurality of electronic components. Cold air is passed from the cooling system to the base of the containment unit through the damper and into the containment area. Warm air is removed from the containment area through the passageway formed in the top thereof and back to the cooling system. The warm air removed from the containment area is cooled by the cooling system, and the control panel is adapted to be in communication with the electronic components contained in the containment area.

38 Claims, 9 Drawing Sheets

U.S. PATENT DOCUMENTS

| | | | | |
|---|---|---|---|---|
| 6,597,571 | B2 | 7/2003 | Kubota et al. | |
| 6,616,524 | B2 | 9/2003 | Storck, Jr. et al. | |
| 6,628,520 | B2 | 9/2003 | Patel et al. | |
| 6,643,123 | B2 | 11/2003 | Hartel et al. | |
| 6,652,373 | B2 | 11/2003 | Sharp et al. | |
| 6,652,374 | B2 | 11/2003 | Sharp et al. | |
| 6,668,565 | B1 | 12/2003 | Johnson et al. | |
| 6,672,955 | B2 | 1/2004 | Charron | |
| 6,722,151 | B2 | 4/2004 | Spinazzola et al. | |
| 6,745,579 | B2 | 6/2004 | Spinazzola et al. | |
| 6,772,604 | B2 | 8/2004 | Bash et al. | |
| 6,775,137 | B2 | 8/2004 | Chu et al. | |
| 6,877,551 | B2 | 4/2005 | Stoller | |
| 6,880,349 | B2 | 4/2005 | Johnson et al. | |
| 6,896,612 | B1 | 5/2005 | Novotny | |
| 6,924,981 | B2 | 8/2005 | Chu et al. | |
| 7,010,392 | B2 * | 3/2006 | Bash et al. | 700/276 |
| 7,104,081 | B2 | 9/2006 | Chu et al. | |
| 7,112,131 | B2 | 9/2006 | Rasmussen et al. | |
| 7,123,477 | B2 * | 10/2006 | Coglitore et al. | 361/679.5 |
| 7,140,193 | B2 | 11/2006 | Johnson et al. | |
| 7,144,320 | B2 | 12/2006 | Turek et al. | |
| 7,226,353 | B2 | 6/2007 | Bettridge et al. | |
| 7,255,640 | B2 | 8/2007 | Aldag et al. | |
| 7,259,963 | B2 | 8/2007 | Germagian et al. | |
| RE40,065 | E | 2/2008 | Kotliar | |
| 7,365,973 | B2 | 4/2008 | Rasmussen et al. | |
| 7,397,661 | B2 | 7/2008 | Campbell et al. | |
| 7,416,481 | B2 | 8/2008 | Baker et al. | |
| 7,456,750 | B2 | 11/2008 | Dyer et al. | |
| 7,492,593 | B2 | 2/2009 | Campbell et al. | |
| 7,500,911 | B2 | 3/2009 | Johnson et al. | |
| 7,529,086 | B2 | 5/2009 | Fink et al. | |
| 7,551,436 | B2 | 6/2009 | Hata et al. | |
| 7,558,063 | B2 | 7/2009 | Belady et al. | |
| 7,568,360 | B1 | 8/2009 | Bash et al. | |
| 7,643,291 | B2 | 1/2010 | Mallia et al. | |
| 2003/0109215 | A1 | 6/2003 | Goncalves et al. | |
| 2004/0023614 | A1 * | 2/2004 | Koplin | 454/184 |
| 2004/0132398 | A1 | 7/2004 | Sharp et al. | |
| 2005/0207116 | A1 | 9/2005 | Yatskov et al. | |
| 2005/0237716 | A1 | 10/2005 | Chu et al. | |
| 2005/0268170 | A1 * | 12/2005 | Kearney et al. | 714/32 |
| 2006/0180301 | A1 | 8/2006 | Baer | |
| 2007/0030650 | A1 | 2/2007 | Madara et al. | |
| 2007/0064389 | A1 | 3/2007 | Lewis et al. | |
| 2007/0072536 | A1 | 3/2007 | Johnson et al. | |
| 2007/0076373 | A1 | 4/2007 | Fink | |
| 2007/0103325 | A1 | 5/2007 | Wagner et al. | |
| 2007/0129000 | A1 | 6/2007 | Rasmussen et al. | |
| 2007/0171610 | A1 | 7/2007 | Lewis | |
| 2007/0259616 | A1 | 11/2007 | Scattolin | |
| 2008/0037228 | A1 | 2/2008 | Lewis, II | |
| 2008/0180908 | A1 | 7/2008 | Wexler | |
| 2008/0198549 | A1 | 8/2008 | Rasmussen et al. | |
| 2008/0209931 | A1 | 9/2008 | Stevens | |
| 2008/0212265 | A1 | 9/2008 | Mazura et al. | |
| 2008/0300725 | A1 * | 12/2008 | Brey et al. | 700/278 |
| 2009/0000243 | A1 | 1/2009 | Blumberg | |
| 2009/0014548 | A1 | 1/2009 | Criss et al. | |
| 2009/0021907 | A1 | 1/2009 | Mann et al. | |
| 2009/0034309 | A1 | 2/2009 | Ibori et al. | |
| 2009/0122484 | A1 | 5/2009 | Caveney | |
| 2009/0188682 | A1 | 7/2009 | Gensel et al. | |

* cited by examiner

CLOSED DATA CENTER CONTAINMENT SYSTEM AND ASSOCIATED METHODS

RELATED APPLICATIONS

This application claims the benefit of U.S. Provisional Patent Application Ser. No. 61/049,847 titled Totally Enclosed, Modular 2-6 Computer Rack Data Center (Named Data Center In A Row) Designed To Provide A Secure Environmentally Controlled Housing For Computers filed on May 2, 2008, and is related to U.S. patent application Ser. No. 12/434,257, titled Fire Suppression System And Associated Methods filed simultaneously herewith by the inventor of the present application, the entire contents of each of which are incorporated herein by reference.

FIELD OF THE INVENTION

The present invention relates to the field of containment units for electronic components and, more particularly, to containment units for electronic components that are expandable and include fire suppression systems, and associated methods.

BACKGROUND OF THE INVENTION

As technology has increased in the recent past, and as the use of servers has become more prevalent, there has arisen a need to provide data centers for storing such electronic components. Such components give off a great deal of heat, and it is preferably to ensure that these electronic components do not overheat. The failure of a single electronic component, such as a network server, for example, may cause the shutdown of an entire business. Accordingly, it is desirable to ensure that these electronic components do not overheat.

In addition humidity control is generally required to reduce the likelihood of short circuiting and static electricity which can cause damage to the electronic components. As these computer systems have a direct bearing on the company's well being, fire detection, non-destructive fire suppression and reliable stable power are essential to ensure continuous operation and availability of these systems. A tier rating system has been developed to determine the level of reliability and availability of the support systems. Tier #1, for example, is the lowest level of reliability and Tier #4, for example, is the highest level of reliability. In order for a system to be rated at a Tier #4 level, the cooling systems must have two independent cooling systems and two power systems. Those skilled in the art understand this arrangement as 2N. An issue has, however, arisen regarding the power consumption required to support and operates these systems, and the desire to have a more energy efficient system, instead of the traditional approaches currently being utilized.

A traditional approach to addressing these requirements is use of an open architecture system. Such open architecture systems attempt to build a vapor sealed, sound proof and secure room for housing the electronic components. Once such a room has been constructed, then the addition of fire detection and suppression, environmental control systems and power distribution are added to provide the proper environment for the electronic components, as well as power to be supplied to all of the electronic components. Such construction, however, may be costly, and may not even be possible depending on the age of the building within which it is to be constructed. As computer systems continue to evolve, the construction costs to accommodate these changes may be extensive and repetitive.

U.S. Published Patent Application No. 2007/0030650 by Madara et al. discloses a cooling system and associated cabinet for electronic equipment and, optionally, a backup ventilation system for cooling related failures. The system disclosed in Madara et al. '650 includes a high capacity closed loop refrigeration system in a modified cabinet, while accommodating standard sized computer equipment. Further, the system provides directed heat removal by altering typical airflow paths within the cabinet. The backup ventilation system is powered by auxiliary power in the case of power failure and uses the same fan for ventilation as is used for cooling. This system, however, may be cumbersome in that it may require at least three portions to be operational, i.e., a first portion to support the equipment, a second portion to enclose a portion of the refrigeration system, and a third portion to enclose a condenser. This system discharges warmed air into the room in which it is positioned requiring additional cooling equipment to remove the warm air from the room within which it is positioned. Further, a system such as disclosed in Madara et al. '605 is not expandable to accommodate additional electronic components. The system also fails to provide fire protection and suppression to extinguish a fire within a containment area, and has limited space available for electronic equipment to be stored therein. The Madara et al. '605 system also requires engaging in a lengthy procedure to service the system with the doors open. Such a system is typically limited to a Tier #3 rating, as discussed above, as it is not capable of providing two independent cooling systems.

U.S. Published Patent Application No. 20040132398 by Sharp et al. discloses an integrated, stand-alone cabinet or group of cabinets for supporting electronic equipment. The cabinet contains a liquid cooling system, an airflow distribution device, a fire suppression system, an uninterruptible power supply system, a power quality management system, a cabinet remote monitoring and control system, a remote control and management system for the electronic equipment contained within the cabinets, an EMC/RFI/EMI containment and filter system, and an acoustic noise control system. The Sharp et al. '398 system, however, is limited to chilled water systems and may not meet fire suppression codes. Additionally, this detection system does not provide shutdown controls for the cooling and/or uninterruptible power systems as required by local fire codes. The Sharp et al. '398 system also fails to provide an interface to the building fire system as required by most fire codes. This system is also dependent on an external building chilled water supply and does not provide secondary backup ventilation. Without such backup ventilation, the internal temperature may rise rapidly resulting in computer shutdown due to excessively high temperatures within the containment area. Service of the cooling systems may require shutdown of the respective computer equipment within the containment area. This system also is typically limited to a Tier #3 rating, as discussed above, as it is not capable of providing two independent cooling systems.

Accordingly, improvement is needed to containment systems for containing electronic components.

SUMMARY OF THE INVENTION

With the foregoing in mind, it is therefore an object of the present invention to provide a self contained containment system having a containment area to contain and cool electronic components. It is also an object of the present invention to provide a containment system that controls environmental conditions within a containment area. It is further an object of the present invention to provide an integrated power system for a containment system. It is still further an object of the present invention to provide a containment system that is operational during a power failure. It is yet another object of the present invention to provide a containment system that is easily and economically expandable.

These and other objects, features and advantages according to the present invention are provided by a containment system comprising a control unit and at least one containment unit in communication with the control unit. The control unit may include a cooling system and at least one control panel in communication with the cooling system. The containment unit may be used to contain a plurality of electronic components and may include a base including at least one damper, a plurality of sidewalls extending upwardly from the base and a top overlying the base and having at least one passageway formed therein.

The base, the plurality of sidewalls and the top of the containment unit may define a containment area therebetween. Cooled air may be passed from the cooling system to the base of the containment unit, through the at least one damper and into the containment area. Warm air may be removed from the containment area through the passageway formed in the top and may be sent back to the cooling system. The warm air removed from the containment area may then be cooled by the cooling system. Warm air emitted from the cooling system may be removed from the control unit and remotely cooled.

The control panel is in communication with a global communications network and may include a wireless transceiver for wirelessly receiving and transmitting signals relating to conditions within the containment area. Accordingly, the containment system may advantageously provide remote monitoring of electronic components carried within the containment area, and may also provide for remote monitoring of conditions within the containment area.

The damper may be adjustable to adjust a volume of cooled air passed from the cooling system and into the containment area. Accordingly, the containment system advantageously provides for a pro per amount of cooling depending upon conditions within the containment area, thereby enhancing energy efficiency. The containment unit is adapted to be connected to additional containment units advantageously making the containment system readily expandable without the need for significant reconfiguration.

The cooled air may be directed towards a rear portion of the containment area of the containment unit. This advantageously ensures that cooled air is directed to the generally warmest parts of the electronic components, and also decreases cool air loss that may occur when a front door portion of the sidewalls of the containment unit is opened. The top of the containment unit may include a duct in communication with the control unit to direct warm air from the containment area of the containment unit to the cooling system. The containment system may include an exhaust fan carried by the top of the containment unit and in communication with the control panel. The exhaust fan may be operational between an activated position and a deactivated position. More particularly, the exhaust fan may be operated in the activated position if the cooling system fails. This advantageously provides backup cooling within the containment area in the case of a failure of the cooling system.

The containment system may also include an environmental control system carried by the control unit and in communication with the control panel. An environmental sensor may be carried by the containment unit and be positioned in communication with the environmental control system. The environmental control system is operational between a humidifying position and a dehumidifying position to control humidity in the containment unit responsive to a reading received from the environmental sensor. Accordingly, the containment system may include a humidifier and/or a dehumidifier to control humidity in the containment area of the containment unit responsive to the reading received from the at least one environmental sensor. Therefore, the containment system advantageously allows for environmental conditions within the containment area to be monitored and controlled without the need to activate the cooling system, if not necessary, thereby also enhancing the energy efficiency of the containment system.

The control unit may be adapted to be connected to an external power source, allowing the control unit to provide power to the containment unit. Accordingly, the containment system is advantageously self contained in that additional power sources are not required to power either the containment unit or the electronic components carried by the containment unit. The containment system may also include a backup power source carried by the control unit and in communication with the control panel. This advantageously ensures that each of the control unit, the control panel and the containment unit remain powered in the event of a power interruption.

The containment system may further include a temperature sensor carried by the containment unit and in communication with the control panel. The control panel may monitor the temperature within the containment area of the containment unit. The containment unit may be divided into a plurality of containment zones, and the control panel may individually monitors the temperature in each of the plurality of containment zones. Accordingly, the containment system advantageously provides enhanced monitoring to ensure that electronic components carried in the containment area are being maintained within desired temperature ranges.

A method aspect of the present invention is for using a containment system. The method may include connecting a first containment unit to a control unit. The method may also include connecting additional containment units to the first containment unit in series so that each additional containment unit is positioned in communication with the control unit. The method may further include passing cooled air from the cooling system to the base of each of the plurality of containment units through the damper and into the containment area of each of the plurality of containment units. The method may still further include removing warmed air from the containment area of each of the plurality of containment units through the passageway formed in the top of the containment unit, and cooling the warm air removed from the containment area using the cooling system.

DETAILED DESCRIPTION OF THE PREFERRED EMBODIMENT

Figure 1:
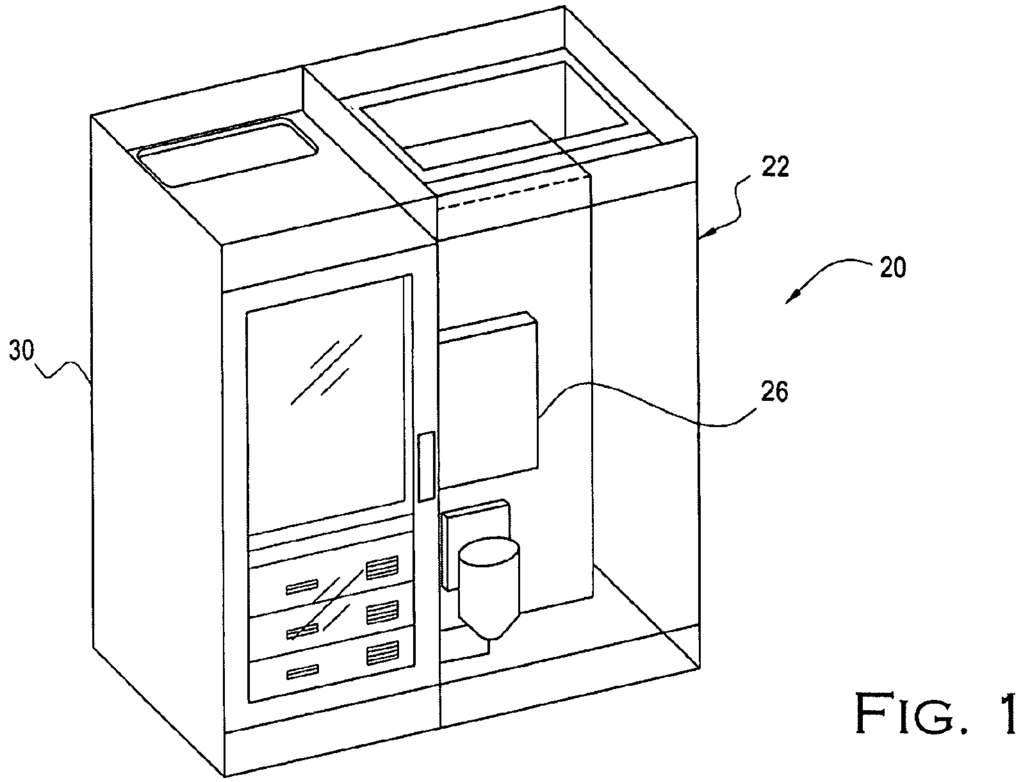
FIG. 1 is a perspective view of a containment system according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these, embodiments are provided so that this disclosure will be thorough and complete, and will fully convey the scope of the invention to those skilled in the art. Like numbers refer to like elements throughout.

Referring now to the appended figures a containment system 20 and a fire suppression system 80 according to the present invention are now described in greater detail. More specifically, the containment system 20 includes a control unit 22 and at least one containment unit 30. The containment system 20 according to the present invention is advantageously expandable as illustrated, for example, in FIG. 2. In other words, the containment system 20 according to the present invention may initially only include one containment unit 30, but additional containment units may be connected to the first containment unit as needed by the user without the need for significant reconfiguration of the containment system.

The control unit 22 includes a cooling system 24, and a control panel 26 in communication with the cooling system. The control panel 26 is used to control the cooling system 24, as understood by those skilled in the art. Additional details of the control panel 26 are provided below. Each containment unit 30 is in communication with the control unit 22 and is adapted to contain a plurality of electronic components. The electronic components, may, for example, be computer electronics such as servers, routers, telecommunication devices, or other networking devices as understood by those skilled in the art. Each containment unit 30 may include a base 32 having a damper 34 formed therein. As illustrated, for example, in FIGS. 3, 3A, and 3B, the damper 34 is carried by the base 32 to allow air to flow within the containment unit 30. The damper 34 illustrated in FIG. 3A is illustrated as being positioned between the opened and closed positions, i.e., in a semi-opened position. The damper 334 illustrated in FIG. 3B is illustrated as being positioned in a fully opened position. Those skilled in the art will appreciate that the damper 34 may be positioned anywhere between the opened and closed positions depending upon the amount of cooled air is needed to be introduced into the containment area 46. Additional details of airflow within the containment unit 30 are provided below.

Those skilled in the art will appreciate that the control panel 26 may include several elements. For example, the control panel 26 preferably includes a thermostat positioned within the control unit 22. As will be discussed in greater detail below, the thermostat within the control unit 22 may be used to monitor the temperature of the air throughout any portion of the containment system 20. The control panel 26 may also include a power distribution panel. As will also be discussed in greater detail below, the power distribution panel may advantageously be connected to an external power source 64 to provide power throughout the containment system 20. More specifically, the power distribution panel may, for example, be in communication with each of the containment units 30 to provide power thereto, and to also provide power to each of the electronic components within the containment area 46.

Those skilled in the art will appreciate that the thermostat and the power distribution panel of the control panel 26 may be provided in combination or as separate and distinct units. Those skilled in the art will also appreciate that the thermostat and the power distribution panel may be positioned in communication with one another. More specifically, the thermostat is preferably powered by the power distribution panel. Generally speaking, anything requiring power within the containment system 20 according to the present invention is preferably connected to the power distribution panel. This advantageously allows power distribution within the containment system 20 according to the present invention to be centralized. This also advantageously eliminates any need for multiple power sources to be connected to the containment system. Accordingly, each containment unit 30 may be powered by connection to the power distribution panel. The power distribution panel may also provide power throughout each of the containment units 30 to advantageously provide power to any electronic component carried therein.

Each containment unit 30 also includes a plurality of sidewalls 36 extending upwardly from the base 32, and a top 42 overlying the base 32, preferably resting on the top portion of the sidewalls 36. More specifically, the top 42 is preferably mechanically connected to a top portion of the sidewalls 36 of the containment unit 30. The top 42 of the containment unit 30 illustratively includes a passageway 44 formed therein. As will be discussed in greater detail below, the passageway is adapted to receive warmed air from the containment area 30 to be transported back to the control unit 32.

The base 32, sidewalls 36 and the top 42 of the containment unit 30 define a containment area 46 therebetween. Accordingly, the electronic components are preferably carried by the containment unit 30 within the containment area 46. Those skilled in the art will appreciate that the containment area 46 may be divided into a plurality of containment zones 70A, 70B, 70C, 70D. These containment zones 70A, 70B, 70C, 70D may be defined by racks within the containment area 46. Racks within the containment area 46 may, for example, be provided by shelving units, or other known dividers for carrying the electronic components within the containment area. The containment unit 30 is preferably thermally insulated.

Figure 2:
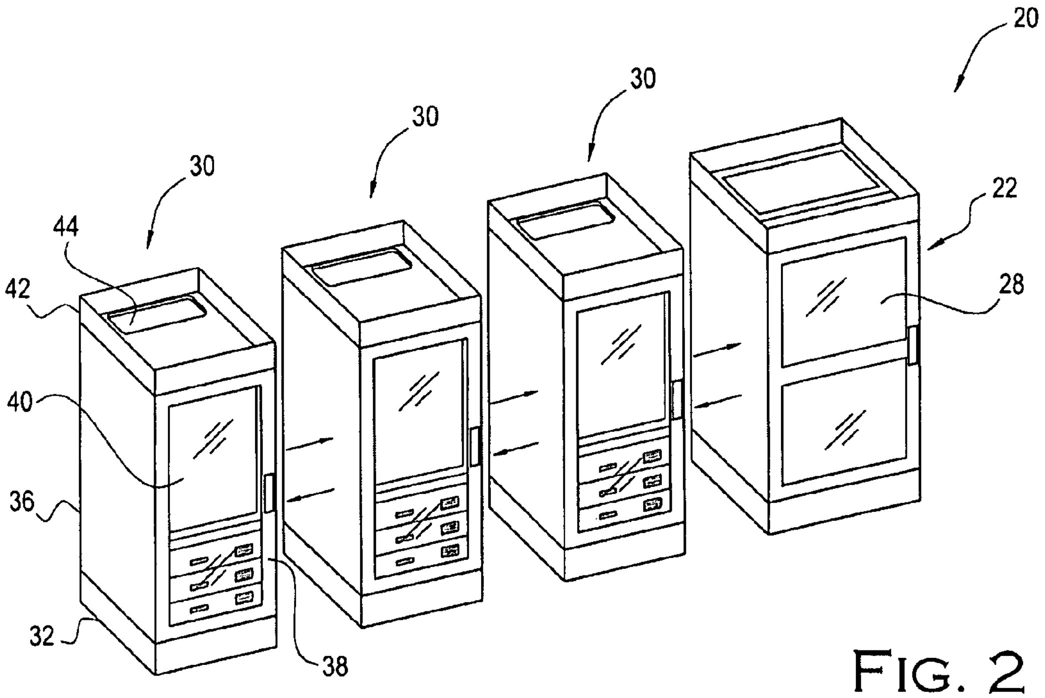
FIG. 2 is an exploded perspective view of a plurality of containment system according to the present invention including a plurality of containment units connected to a control unit.

As illustrated, for example, in FIGS. 1 and 2, a front portion of each of the containment units 30 may include a door 38 formed therein. In other words, one of the sidewalls 36 of the containment unit 30 may be a door 38, or may partially be a door. The door 38 in the containment unit 30 may, for example, be a hinged door that provides access to the containment area 46 and, more specifically, to the electronic components carried within the containment area. The door 38 of the containment unit 30 may include a glass panel 40 to advantageously provide visibility into the containment area 46 of each of the containment units. Similar to each of the containment units 30, the control unit 22 may also include a front portion comprising a door 28. The door 28 of the control unit 22 may also be hinged and may also include glass panels formed therein to allow for visibility within the control unit.

Cooled air is preferably passed from the cooling system 24 to the base 32 of each of the containment units 30 and through the damper 34 formed in the base to be introduced into the containment area 46. The cooled air advantageously reduces, or counteracts, heat build up within the containment area 46 caused by heat emitted from the electronic components. Those skilled in the art will appreciate that the electronic components emit a great amount of heat, and require cooling to run efficiently and to prevent over heating. Accordingly, the cooled air passed from the cooling system 24 and into the containment area 46 advantageously addresses these problems.

Warm air is removed from the containment area 46 through the passageway 44 formed in the top 42 of the containment unit 30. As perhaps best illustrated in FIG. 4, the warmed air is then transported back to the control unit 22 and, more specifically, to the cooling system 24 to again be cooled and reintroduced to the containment area 46 to cool the electronic components stored therein. This configuration advantageously allows the containment system 20 to be self contained, thereby preventing any warm air generated by the electronic components from being emitted into the room within which the containment system is housed. Further, this advantageously allows the containment system 20 according to the present invention to be positioned in any room within any structure without the need to structurally modify the room, i.e., without the need to add extra cooling systems to the room, sealing the room or adding sound-proofing material to the room.

The control panel 26 may be positioned in communication with the electronic components contained in the containment area 46. This advantageously allows the control panel 26 to be used to monitor the electronic components stored in the containment area 46. This configuration also advantageously provides power to each of the containment units 30 so that containment system 20 according to the present invention is truly self contained, i.e., there is no need for each containment unit to be connected to another power source. Instead, and as perhaps best illustrated in FIG. 2, the control unit 22 includes a power supply to supply a power to each of the containment units 30. This power supply may also be used to provide power to each of the electronic components stored in the containment area 46 of each of the containment units.

The control panel 26 of the control unit 22 is advantageously positioned in communication with a global communications network 48. Accordingly, a user may access the control panel 26 of the containment system 20 via the Internet, for example, to monitor conditions within the containment area 46 and, more specifically, to monitor each of the electronic components carried within the containment area. Further, the control panel 26 may include a wireless transceiver 50. The wireless transceiver 50 advantageously allows the control panel 26 to be positioned in wireless communication with the global communications network 48.

The present invention advantageously contemplates that the control panel 26 may transmit signals relating to conditions within the containment area 46, and may also transmit signals relating to the conditions of each of the electronic components stored within the containment area. These signals may be adapted to be received by any number of devices. For example, the signals may be transmitted to a server which, in turn, compiles data relating to the signals. A user may then access the server to monitor the data relating to conditions within the containment area 46, as well as conditions relating to the electronic components stored within the containment area. Those skilled in the art will also appreciate that the signals may be used to run an application that may provide alert indications to a user via any number of mobile devices, i.e., a cell phone. The present invention also contemplates the capability of the wireless signal transmitted by the control panel 26 being used to generate an electronic message, i.e., an e-mail, to a user regarding conditions within the containment area 46 and/or conditions relating to the electronic components carried within the containment area. The electronic message transmitted to the user may provide an update to the status of the containment system 20 within a predetermined time range, i.e., transmit a message relating to the status of the containment system every hour, or may be set to provide a notification to a user if a particular reading within the containment system 20 is outside of a predetermined range. The present invention further contemplates delivering such information in a text message to the user, or even posting the information on a user's social networking page.

The containment system 20 according to the present invention also contemplates the use of the wireless transceiver 50 carried by the control panel 26 to wirelessly communicate with the electronic components carried within the containment area 46. Those skilled in the art will appreciate that this requires the electronic components to include a wireless transceiver. The wireless transceivers may, for example, be provided by radio frequency transceivers, as understood by those skilled in the art.

Figure 3:
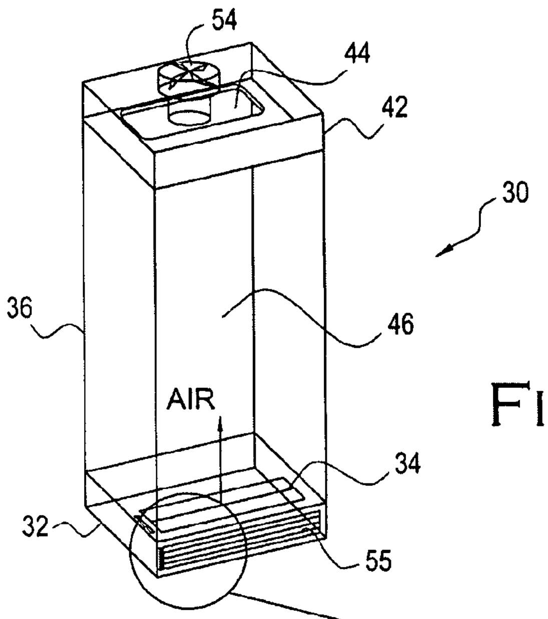
FIG. 3 is a perspective view of one of the containment units illustrated in FIG. 2 showing a damper in the containment unit in a closed position.
Figure 3A:
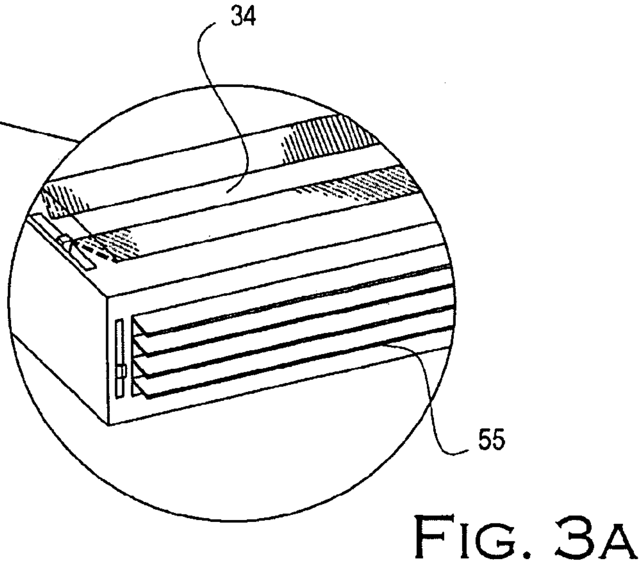
FIG. 3A is a detail view of the damper of the containment unit illustrated in FIG. 3 being positioned between the closed position and an opened position.
Figure 3B:
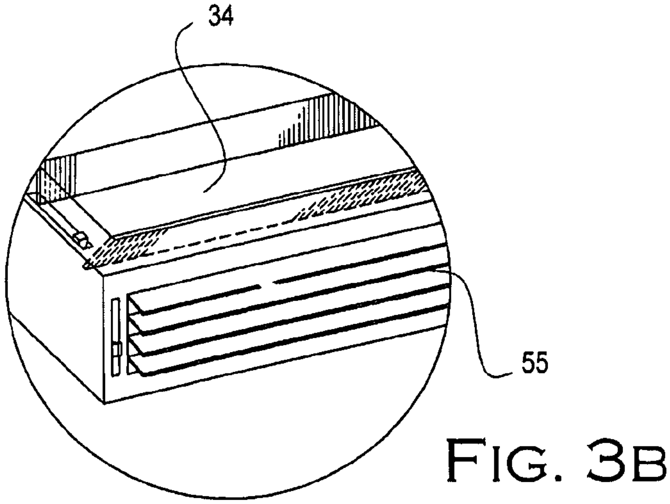
FIG. 3B is a detail view of the damper of the containment unit illustrated in FIG. 3 being positioned in the opened position.

As perhaps best illustrated in FIGS. 3 and 3A, the damper 34 in the base 32 of each containment unit 30 may be movable between open and closed positions. More specifically, the damper 34 may be used to adjust the volume of cooled air passed from the cooling system 24 into the containment area 46. The damper 34 illustrated in FIGS. 3 and 3A uses a lever to be moved between the open and closed positions. Although a manually operated damper 34 is illustrated in FIGS. 3 and 3A, the containment system 20 according to the present invention contemplates the use of automatic dampers. More specifically, the containment system 20 according to the present invention may use automatic dampers positioned in communication with the control panel 26 that are movable between the open position and the closed position to adjust the volume of cool air passed from the cooling system 24 into the containment area 46 of each containment unit 30 based on signals received from the control panel 26. In other words, the control panel 26 may monitor the temperature within the containment system and send signals to the damper 34 to be moved between the opened and closed positions depending on the sensed temperature. Temperature monitoring within the containment area 46 will be discussed in greater detail below.

As perhaps best illustrated in FIG. 2, the containment system 20 according to the present invention is advantageously expandable. More specifically, a base containment system 20 may include a control unit 22 and one containment unit 30. The user may initially purchase, for example, a single containment unit 30 based on the user's electronic component storage needs at the time of purchase. Over a period of time, however, it may be necessary for the user to obtain additional electronic component storage space. Accordingly, an additional containment unit 30 may advantageously be connected to the containment system 20 without the need to add any additional control units 22. In other words, additional containment units 30 may still be supported by the cooling system 24 and the control panel 26 carried within the control unit 22. This advantageously eliminates additional costs associated with adding more cooling capacity, for example, when an additional containment unit 30 is added to the containment system 20.

Additional containment units 30 are preferably mechanically connected to existing containment units. Further, and with reference to FIG. 4, when additional containment units 30 are added to the containment system 20, it is preferable that duct work in the bases 32 of the containment units 30 leading to the dampers 34 in the bases are aligned with one another so that the cooled air from the cooling system 24 may be continuously passed through all of the containment units 30. Similarly, it is preferable that ducts 52 in the tops 42 of each of the containment units 30 are also aligned to provide a continuous duct so that as warm air is passed from within the containment area 46 through the passageway 44 in the top of each containment unit, the warm air may be continuously transported back to the cooling system 24 to be cooled and reintroduced into the containment units 30 via the dampers 34 in the bases 32 of each containment unit 30.

When cooled air is introduced into the containment area 46 via the damper 34 in the base 32 of each containment unit 30, it is preferable that the cooled air is directed towards a rear portion of the containment area, as this advantageously directs the cooled air towards the warmest part of each of the electronic components. More specifically, heat is generally emitted adjacent a rear portion of the electronic components. Accordingly, the cooled air being directed to the rear portion of each of the containment units 30 advantageously allows the cooled air to be directed towards the warmest portions of the electronic components.

As mentioned above, the top 42 of each of the containment units 30 illustratively includes a passageway 44 formed therein. The passageway 44 leads to a duct 52 in the top 42 of each of the containment units 30. The duct 52 is illustratively positioned in communication with the control unit 22 so that the warm air generated by heat emission from the electronic components may be removed from within the containment area 46 into the duct and back to the cooling system 24 of the control unit.

Figure 4:
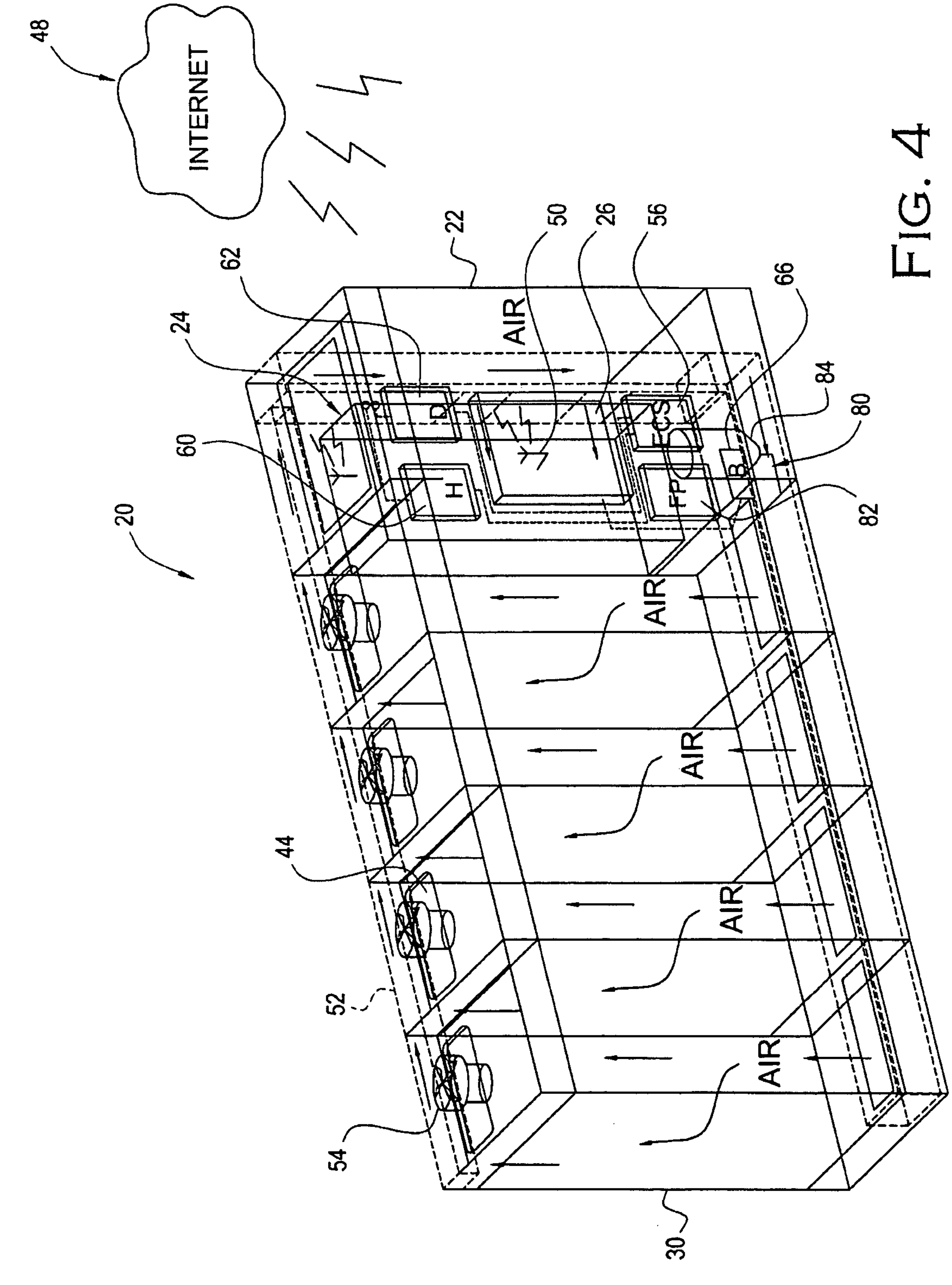
FIG. 4 is a schematic perspective view of the containment system according to the present invention showing air flow therethrough.

As also illustrated in FIG. 4, each of the containment units 30 may also include an exhaust fan 54. The exhaust fan is in communication with the control panel 26 of the containment system. The exhaust fan 54 is preferably used as a backup in an instance when the cooling system 24 fails. More specifically, the exhaust fan 54 is operational between an activated position and a deactivated position. Accordingly, if the cooling system 24 fails, the control panel 26 may transmit a signal to activate each of the exhaust fans 54. Activation of the exhaust fan 54 from the deactivated position to the activated position advantageously removes warm air generated by heat emitted from the electronic components from the containment area 46.

Those skilled in the art will appreciate that the exhaust fans 54 are only to be used in the rare instance when there is a failure of the cooling system 24. Those skilled in the art will also appreciate that it may be desirable to use the exhaust fans 54 as a supplement to the cooling system 24 when heat emission from the containment units 30 is not a factor. For example, if the containment unit is positioned in a spate that is not air conditioned, such as a warehouse, additional heat within the space may not be an issue and, accordingly, the user may desire to activate the exhaust fans 54 to remove warm air from the containment area.

Atmospheric dampers 55 may be mounted on a front portion of each containment unit 30. In the normal condition, these dampers 55 are closed maintaining a sealed environment within the containment unit 30. In the event the cooling system 24 should fail, the exhaust fans 54 may be activated to draw room air through each containment unit through the atmospheric damper 55 to provide back up cooling.

In such a case, the exhaust fans 54 may be manually operated. The present invention contemplates, however, that the exhaust fans 54 are in communication with the control panel 26 to be automatically operated based on a signal received therefrom. Accordingly, the control panel 26 may sense a power failure and automatically operate the exhaust fans 54 in the activated position. Similarly, upon a restoration of the power, the control panel may send another signal to the exhaust fans 54 to operate the exhaust fans in a deactivated position.

Referring now additionally to FIGS. 5 through 9, additional aspects of the containment system 20 according to the present invention are now described in greater detail. The cooling system 24 within the control unit 22 emits cool air to be introduced into each of the containment systems 30 to cool the containment area 46. Those skilled in the art will appreciate that the cooling system 24 within the control unit 22 emits heat during the cooling process. Accordingly, the cooling system 24 may be connected to a remotely located cooling unit 78 to cool the warm air emitted from the cooling system 24 of the containment system 20 according to the present invention. The remotely located cooling unit 78 may, for example, be a cooling unit carried by the structure within which the containment system 20 according to the present invention is positioned. Accordingly, the control unit 22 may be positioned in communication with the remotely located cooling unit 78. It is preferable that the cooling system 24 in the control unit 22 of the containment system 20 is connected to an existing remotely located cooling unit 78, but those skilled in the art will appreciate that a dedicated remotely located cooling unit may be installed to accommodate the cooling needs of the cooling system.

Figure 5:
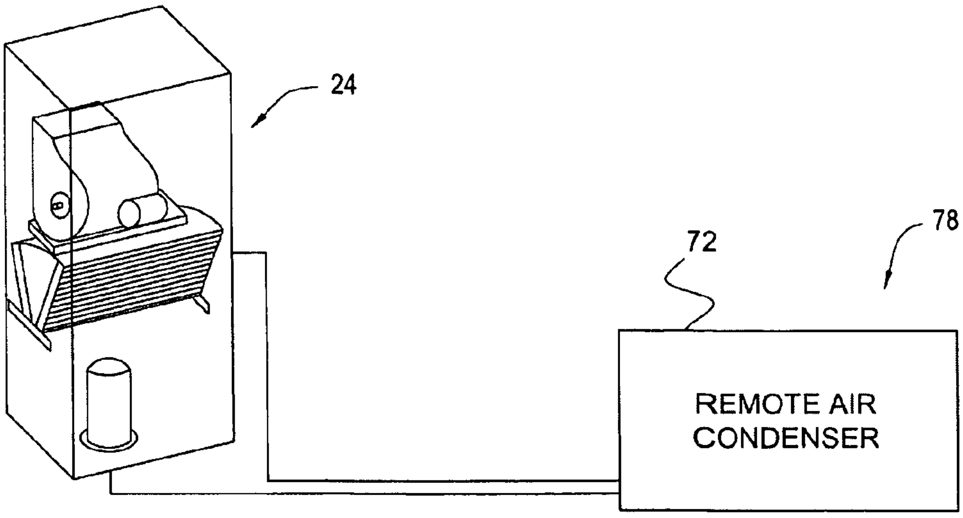
FIG. 5 is a schematic perspective view of the cooling system for a containment system according to the present invention being connected to a remote air condenser.
Figure 6:
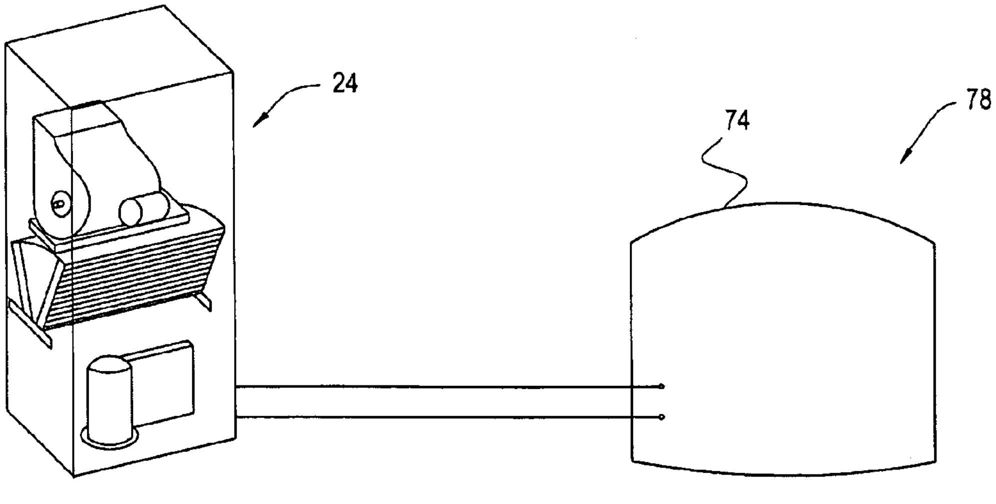
FIG. 6 is a schematic perspective view of the cooling system for a containment system according to the present invention being connected to a chilled water tank.
Figure 7:
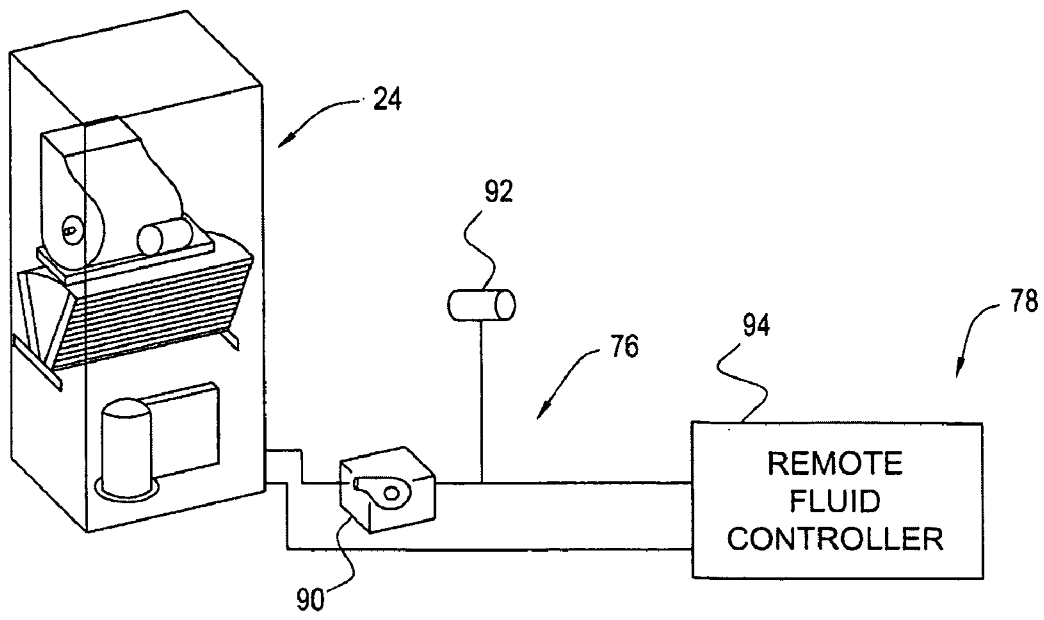
FIG. 7 is a schematic perspective view of the cooling system for a containment system according to the present invention being connected to a glycol cooling system.
Figure 8:
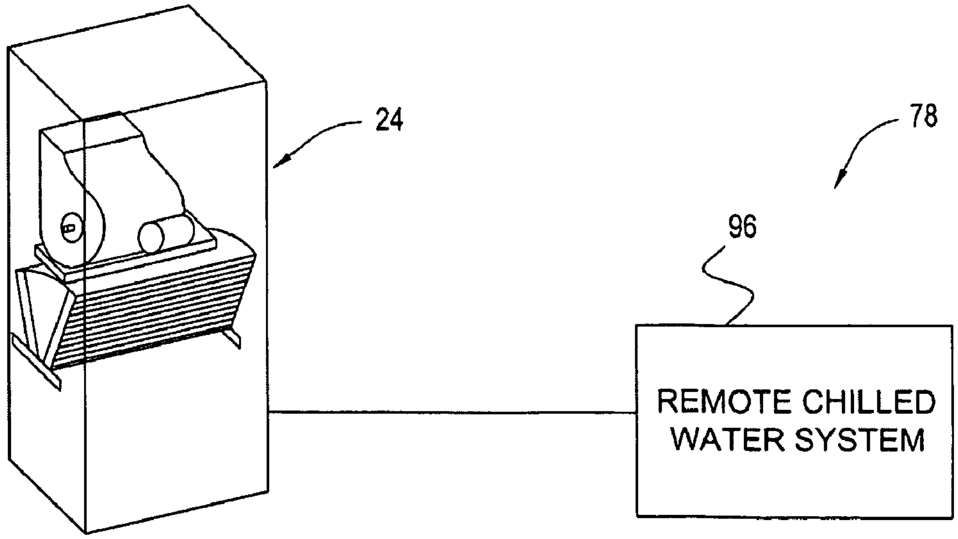
FIG. 8 is a schematic view of the cooling system for a containment system according to the present invention being connected to a remote chilled water system.

The warm air emitted from the cooling system 24 may be transported to any number of different types of cooling units 78. For example, and as illustrated in FIG. 5, the remotely located cooling system 78 may be provided by a remote air condenser 72. As perhaps best illustrated in FIG. 6, the cooling system 24 may be connected to a chilled water tank 74 so that chilled water may be used by the remove the heat emitted from the cooling system 24 to reduce heat within the control unit 22. As illustrated, for example, in FIG. 7, the containment system 20 may be connected to a glycol cooling system 76. The glycol cooling system 76 may include a glycol pump 90, an expansion tank 92, and a remote fluid controller 94. As illustrated in FIG. 9, for example, the cooling system 24 may be connected to a remote-chilled water system 96.

Each of the above referenced remote cooling units 78 may be units that already exist to cool the structure within which the containment system 20 is located. Alternately, each of the above referenced remote cooling units 78 may be units dedicated to the containment system 20 to cool the warm air emitted by the cooling system 24 in the control unit 22. The containment system 20 according to the present invention may advantageously be connected to any remote cooling unit 78 to cool heat emitted from the cooling system 24 and removed from the control unit 22. Accordingly, the containment system 20 according to the present invention advantageously does not require any additional reconfiguration to be connected to any cooling unit 78 that may already be positioned in a structure where the containment system is to be positioned. This advantageously allows a user with a cost effective and efficient containment system 20 that may be readily installed in any structure.

Figure 9A:
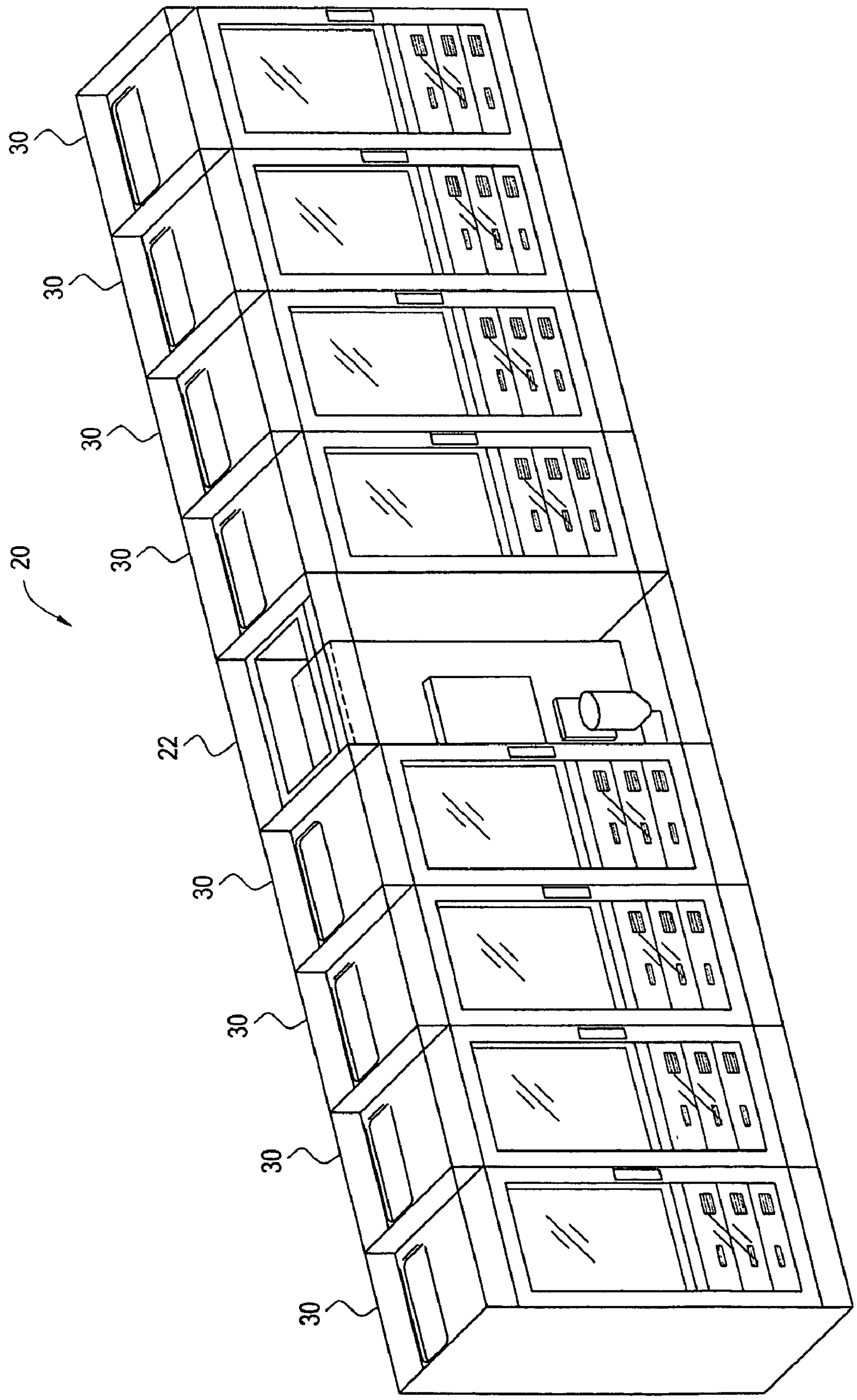
FIGS. 9A-9C are perspective views of varying configurations of the containment system according to the present invention.
Figure 9B:
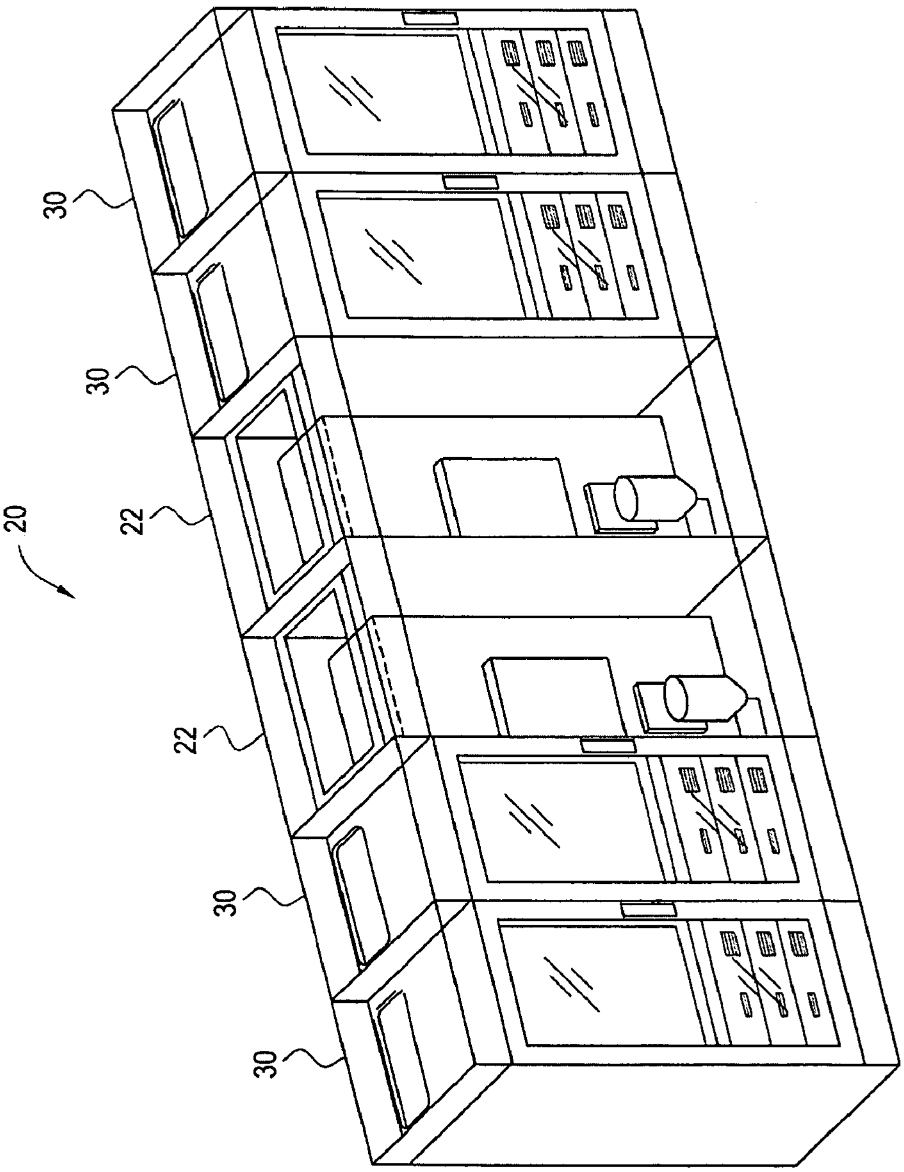
Figure 9C:
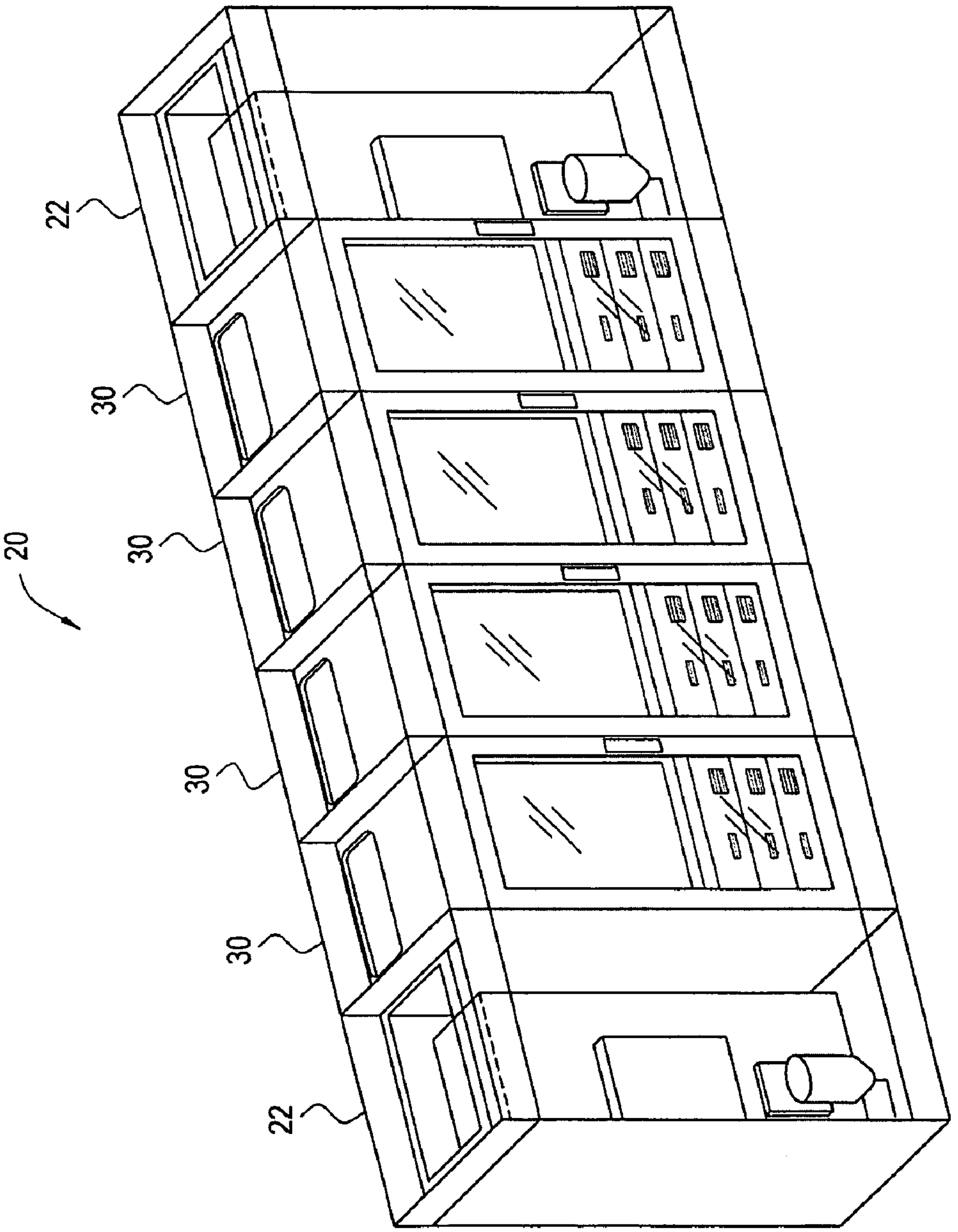

As illustrated, for example, in FIGS. 9A-9C, the containment system 20 according to the present invention may have many different configurations. For example, and with particular reference to FIG. 9A, the containment system 20 may include the control unit 22 positioned in a medial portion thereof and have multiple containment units 30 positioned on either side of the control unit, and preferably in opposite directions. As illustrated, for example, in FIG. 9B the containment system 20 may include a plurality of control units 22 positioned in a medial portion thereof and have multiple containment units 30 positioned on either side of the containment unit. This configuration advantageously provides a 2N containment system 20, meaning a containment system that includes at least two cooling systems 22 and two power distribution panels.

Accordingly, the containment system 20 illustrated in FIG. 9B advantageously provides a user with a Tier #4 type of system to accommodate many different needs. As illustrated, for example, in FIG. 9C, the containment system 20 according to the present invention may include control units 22 positioned on either end thereof and having a plurality of containment units 30 connected therebetween. The illustrations shown in FIGS. 9A-9C are meant to be exemplary and not limiting. Those skilled in the art will appreciate that the containment system 20 according to the present invention may be configured in any number of ways to meet any number of needs with respect to electronic equipment storage, cooling and fire protection.

Figure 10:
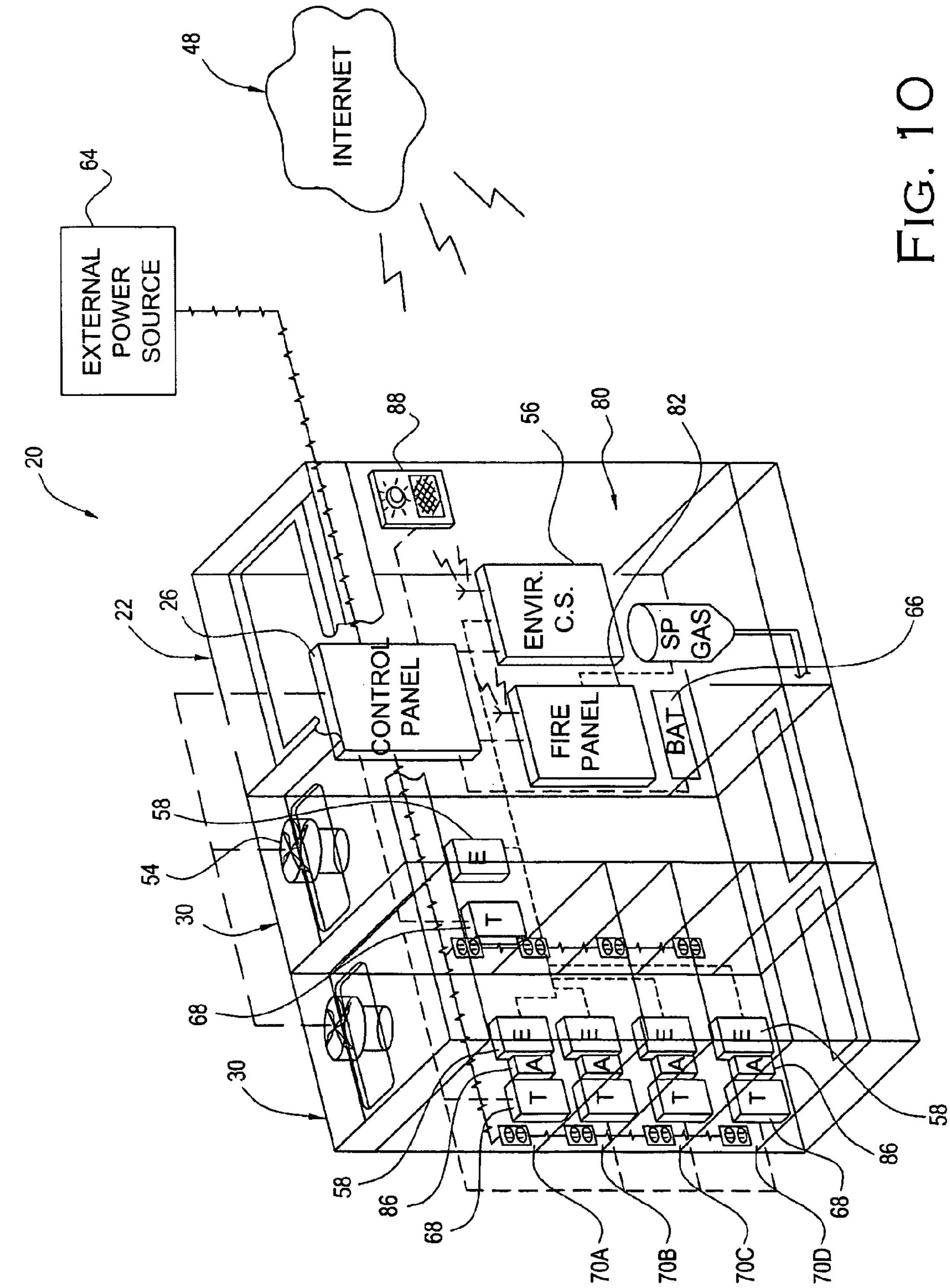
FIG. 10 is a schematic view of a control unit according to the present invention including a fire suppression system.

Referring now additionally to FIG. 10, additional features of the containment system 20 are now described in greater detail. More specifically, and as illustrated in FIG. 10, the containment system 20 includes an environmental control system 56 carried by the control unit 22. The environmental control system is also positioned in communication with the control panel 26 and, more specifically, with the power distribution panel. Each of the containment units 30 may include an environmental sensor 58. As illustrated in FIG. 10, a containment unit 30 may include a single environmental sensor 58 positioned anywhere within the containment area 46, or may include a plurality of environmental sensors to be carried within the containment area so that environmental conditions within each containment zone 70A, 70B, 70C, 70D may be monitored. Each of the environmental sensors 58 are positioned in communication with the environmental control system 56. The environmental sensors 58 operate to sense environmental conditions within the containment area 46, and within each containment zone 70A, 70B, 70C and 70D. More particularly, the environmental sensors 58; preferably detect the amount of humidity within the containment area 46. The environmental control system 56 is operational between a humidifying position and dehumidifying position to control humidity in each of the containment units 30 responsive to readings received from the environmental sensors 58.

The containment system 20 according to the present invention may also include a humidifier 60 and/or a dehumidifier 62. The humidifier 60 and the dehumidifier 62 are preferably carried by the control unit, and positioned in communication with the environmental control system 56 and with the power distribution panel. The humidifier 60 and dehumidifier 62 are operational to adjust the humidity within the containment area 46 responsive to the readings received from the environmental sensors 58 via the environmental control system 56. For example, if the environmental sensors 58 sense an increased amount of humidity within the containment area 46, a signal may be transmitted to the environmental control system 56 to activate the dehumidifier 62 to remove some of the humidity from within the containment area. Similarly, if the environmental sensors 58 sense excessive dryness within the containment area 46, then a signal is sent to the environmental control system 56 to activate the humidifier 66 to increase humidity within the containment area. Those skilled in the art will appreciate that dry conditions within a containment area may lead to high static electricity and is not desirable.

The present invention contemplates that a containment system 20 may not necessarily include both a humidifier 60 and a dehumidifier 62. This may depend on the geographical location where the containment system 20 is to be positioned. More specifically, if the containment system 20 is to be positioned in a geographical location that is subject to typically high humidity, e.g., Florida, then a humidifier 60 may not be necessary.

The containment system 20 according to the present invention contemplates that environmental sensors 58 may be individually monitored by the environmental control system 56. Accordingly, it may be possible that an environmental sensor 58 positioned in a first containment unit 30 may sense that the containment area 46 is dry, while an environmental sensor located in a second containment unit 30 may sense that the conditions within the containment area are humid. Accordingly, upon receipt of these signals by the environmental control systems 56, both the humidifier 66 and the dehumidifier 62 may be activated to provide humidity to the first containment unit 30 and remove-humidity from the second containment unit, for example. It is contemplated that this may occur simultaneously, or in series.

As also illustrated in FIG. 10, the containment system 20 may be connected to an external power source 64. More specifically, connection to the external power source 64 may be as simple as connecting to an alternating current (AC) device, i.e., a traditional wall plug. Due to the amount of power that may be necessary to provide power to the power distribution panel of the control panel 26, however, a hard wired connection to the structure's electrical system may be necessary. Connecting the containment system 20 to the external power source 64 advantageously provides power to the control unit 22 and, more particularly to the power distribution panel which, in turn, may provide power to each of the containment units 30. The power distribution panel may also be used to provide power to each of the containment zones 70A, 70B, 70C, 70D within each of the containment units 30 to individually power each electronic component carried by each of the containment units.

The containment system 20 may also include a backup power source 66 carried by the control unit 22. The backup power source 66 is preferably positioned in communication with the control panel 26 to provide backup power to the containment system in the event of a failure of the external power source 64. The backup power source 66 may, for example, be provided by a battery. Those skilled in the art will appreciate that the containment system 20 according to the present invention may be connected to a backup power system of a structure within which the containment system may be positioned. For example, it is not uncommon for a structure to include a backup power generator. The containment system 20 according to the present invention may, for example, be connected to the backup power generator to provide backup power in the case of a power failure. Those skilled in the art will appreciate, however, that the backup power generator will generally provide power throughout the structure which, in turn, will provide power to the containment system 20, thereby eliminating the need for additional backup power. Those skilled in the art will also appreciate that the containment system 20 according to the present invention may also be connected to a dedicated backup power system, i.e., a dedicated backup power generator.

As also illustrated in FIG. 10, the containment system 20 according to the present invention illustratively includes a plurality of temperature sensors 68. Each of the temperature sensors 68 is preferably positioned in communication with the control panel 26 of the control unit 22. The temperature sensors 68 allow the control panel 26 to monitor the temperature within the containment area 46 of each of the containment units 30. As illustrated in FIG. 10, a containment unit 30 may include a single temperature sensor 68 to monitor the temperature of the entire containment area 46. Alternately, the containment unit 36 may include a plurality of temperature sensors 68, each positioned to monitor the temperature within each containment zone 70A, 70B, 70C, 70D.

As discussed above, the control panel 26 may include a plurality of thermostats. The thermostats may include temperature sensors or may be positioned in communication with the temperature sensors 68, or any combination thereof. More specifically, it is preferable that the thermostat monitors temperature readings of the air exiting each of the containment units 30. This advantageously provides an indication directed to the heat within the containment area 46. The present invention also contemplates that the thermostats may monitor the temperature of the air being introduced into the containment units 30. This may be achieved by monitoring the temperature in any number of locations. For example, the temperature may be monitored as it is being emitted from the cooling system 24, or may be monitored as it is being passed through the damper 34 into the containment area 46. The thermostats of the containment system 20 according to the present invention advantageously allow for temperature monitoring throughout any portion of the containment system.

The thermostats of the control panel 26, may be positioned in communication with the cooling system 24 to control the cooling system. More specifically, the cooling system 24 may be operated responsive to temperature readings monitored by the thermostats. Further, the dampers 34 in the base 32 of each containment unit 30 may be automatically controlled responsive to the thermostat.

The temperature readings by the temperature sensors 68 are preferably transmitted to the control panel 26 within the control unit 22. The cooling system 24 is communication with the control panel 26 to be operational based on temperature readings received by the control panel from the temperature sensors 68. Accordingly, the cooling system 24 may be operated automatically responsive to the temperature readings received from the temperature sensors 68. Those skilled in the art will appreciate that the cooling system 24 may also be manually operated, or remotely operated. The containment system 20 according to the present invention also contemplates that the cooling system may be remotely operated by a user via the global communications network 48. The present invention also advantageously contemplates an application that allows the user to remotely operate and monitor the containment unit 22, and the temperature therein, using a mobile enabled device, such as an Internet ready phone, for example.

A method aspect of the present invention is for using a containment system 20. The method may include connecting a first containment unit 30 to a control unit 22. The method may also include connecting containment units 30 to the first containment unit in series so that each additional containment unit is positioned in communication with the control unit 22.

The method may further include passing cooled air from the cooling system 24 to the base 32 of each of the containment units 30 through the dampers 34 formed in each of the containment units. The method may still further include removing warmed air from the containment area 46 of each of the plurality of containment units 30 through the passageway 44 formed in the top 42 of each of the containment units. The method may still further include cooling the warmed air removed from the containment area 46 using the cooling system 24 of the control unit 22.

As illustrated in FIG. 10, the containment system 20 according to the present invention may include a fire suppression system 80. The fire suppression system 80 according to the present invention is especially advantageous for any closed environment. The fire suppression system 80 may include a fire panel 82 carried by the control unit 22. Further, the fire panel 82 may be positioned in communication with the control panel 26 and, more specifically, with the power distribution panel. The fire suppression system 80 also includes a suppression agent containment device 84 carried by the control unit 22 and in communication with the fire panel 82. The suppression agent containment device 84 is positioned in communication with the duct work in the base 32 of each of the containment units 30. Accordingly, a suppression agent contained within the suppression agent containment device 84 may be discharged through the ducts in the base 32 of each of the containment units 30 responsive to a signal received from the fire panel 82. Thereafter, the suppression agent is introduced into the containment area 46 via the damper 34 of the base 32 of each of the containment units 30.

The temperature sensors 68 in communication with the control panel 26 are also advantageously positioned in communication with the fire panel 82. Accordingly, the fire panel 82 may monitor temperatures within the containment areas 46 of each of the containment units 30, and may transmit a signal to the suppression agent containment device 84 responsive to the temperature sensors sensing a temperature within the containment area 46 that fall within a predetermined range. In other words, the fire panel 82 may be programmed to send a signal to the suppression agent containment device 84 to discharge the suppression agent into the containment areas 46 if the temperature within the containment area reaches a predetermined temperature or is within a predetermined temperature range. Those skilled in the art will appreciate that although the containment area 46 is warm due to the discharge of heat from the electronic components stored therein, setting the fire panel to send the signal based on the predetermined temperature range may advantageously allow the system to differentiate between normal heat discharged by the electronic components and heat from a fire.

As also illustrated in FIG. 10, the fire suppression system 80 may include a plurality of air sensors 86 carried by each of the containment units 30 and in communication with the control panel 26. The air sensors 86 are positioned in communication with the fire panel 82 via the control panel 26. The air sensors 86 are adapted to sense the air within the containment area 46 and detect the presence of a combustible product within the containment area. Upon detecting the presence of a combustible product within the containment area, a signal may be sent to the fire panel 82 relating to the detection of the combustible material by the air sensors 86. The fire panel 82 may transmit a signal to the suppression agent containment device 84 to discharge the suppression agent contained therein into the contained areas 46 of each of the containment units 30 responsive to the air sensors 86 detecting the presence of the combustible material.

Those skilled in the art will appreciate that the fire suppression system 80 according to the present invention, advantageously allows for each of the containment units 30 to be individually monitored. For example, fire may be detected within a first one of the containment units 30 by either the temperature sensor 68 or the air sensor 86, whereas the temperature sensor and air sensor in the remaining containment units may not detect any fire conditions. Accordingly, the fire panel 82 may send a signal to the suppression agent containment device 84 to release the suppression agent into the first one of the containment units 30, but not in the remaining containment units. This may advantageously be achieved by closing the dampers 34 in the containment units 30 where fire conditions are not sensed. Those skilled in the art will appreciate that the suppression agent containment device 84 may be manually operated by a user to discharge the suppression agent into the containment unit. It is preferable, however, that the suppression agent containment device 84 be automatically operated responsive to a signal received from the fire panel 82.

As further illustrated in FIG. 10, the fire suppression system 80 may also include an alarm 88 carried by the control unit 22 and in communication with the fire panel 82. The alarm 88 is operational between an activated position and a deactivated position. More specifically, the alarm 88 is operational responsive to the signal received from the fire panel. The alarm 88 may, for example, provide an audible indication, a visual indication, or both.

The fire suppression system 80 according to the present invention also contemplates that the alarm 88 is positioned in communication with the control panel 26 so that a signal may be transmitted to via the global communications network 48 that the alarm has been operated in the activated position. The suppression agent may be discharged from the suppression agent containment device 84 a predetermined time after the alarm 88 is positioned in the activated position responsive to the signal received from the fire panel 82. Accordingly, a user may deactivate the fire suppression system 80. This advantageously prevents an accidental discharge of the suppression agent into the containment area 46 if the alarm 88 is a false alarm. The fire suppression system 80 may also include an automatic override to allow a user to override a signal from the fire panel 82 to discharge the suppression agent into the containment units 30. The override may be operated remotely, i.e., over a global communications network.

The fire suppression system 80 according to the present invention may also be positioned in communication with a fire suppression system of a structure within which the containment system 20 is positioned. More particularly, the fire panel 82 of the fire suppression system 80 may be positioned in communication with a counterpart fire panel of a structural fire suppression system. This advantageously allows the fire suppression system of the structure within which the containment system is housed to be responsive to a fire within the containment system. This is especially advantageous to provide fire protection to the structure for a fire incident that may occur within the containment system 20. Since the containment system 20 is substantially insulated a fire suppression system in a structure may not sense a fire condition within the containment system 20 until the fire is large and possibly out of control. To address such a problem, the fire suppression system of the structure may receive a signal from the fire panel 82 relating to an indication of a fire condition within the containment system.

Those skilled in the art will appreciate that the control panel 26 may also operate to record historical data of the containment system 20. For example, the control panel 26 may record temperatures with the containment areas 46 of each of the containment units 30. This may advantageously allow a user to monitor temperature trends over various periods of time, or with respect to various electronic components. This may also advantageously allow the user to monitor if the alarm 88 has ever been activated and, if so, how often it was activated. This may further advantageously allow the user to monitor the amount of cooling that is historically necessary when the containment system 20 according to the present invention is positioned in a particular geographical area, or a particular type of structure, for example.

The suppression agent may be exhausted from within the containment area 46 a predetermined time after the suppression agent is introduced into the containment area. More particularly, the suppression agent may be exhausted through the passageway 44 formed in the top 42 of each of the containment units 30. The fire suppression system 80 according to the present invention contemplates that the exhaust fans 54 may be activated to evacuate the containment area 46 of the suppression agent after a predetermined amount of time.

The suppression agent is preferably non-conductive and/or non-corrosive. This advantageously allows a suppression agent to be used that allows for the electronic components being carried within the containment area 46 to be salvaged, if possible, in the case of a fire. It is preferable that the suppression agent is gaseous, but the fire suppression system 80 according to the present invention contemplates that the suppression agent may have any other form as well.

A method aspect of the present invention is for using a fire suppression system 80. The method may include detecting a temperature within a containment area 46 of a containment unit 30 that falls within a predetermined range. The method may also include transmitting a signal relating to the detected temperature from the control panel 26 to the fire panel 82. The method may further include operating an alarm 88 in one of an activated position and a deactivated position responsive to a signal relating to the detected temperature received from the fire panel 82. The method may still further include discharging a suppression agent carried by the suppression agent containment device 84 within the containment area 46 through the damper 34 responsive to the signal received from the fire panel 82 a predetermined time after the alarm 88 is operated in the activated position responsive to the signal transmitted from the fire panel.

Another method aspect of the present invention is also for using a fire suppression system 80. This method may include detecting a presence of a combustible product within a containment area 46 of a containment unit 30 that falls within a predetermined range. The method may also include transmitting a signal relating to the detection of a combustible material within the containment area 46 from the control panel 26 to the fire panel 82. The method may further include operating an alarm 88 in one of an activated position and a deactivated position responsive to a signal relating to the presence of a combustible material within the containment area 46 received from the fire panel 82. The method may still further include discharging a suppression agent carried by the suppression agent containment device 84 within the containment area 46 through the damper 34 responsive to the signal received from the fire panel 82 a predetermined time after the alarm 88 is operated in the activated position responsive to the signal transmitted from the fire panel.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A containment system comprising:

a control unit comprising a cooling system and at least one control panel in communication with the cooling system;

at least one containment unit in communication with said control unit for containing a plurality of electronic components, said at least one containment unit comprising a base including a lower floor member and an upper floor member spaced apart from the lower floor member, the upper floor member carrying at least one damper, the base defining a region between the upper and lower floor members for receiving cooled air from the cooling system, a plurality of sidewalls extending upwardly from the base, and a top overlying the base and having at least one passageway formed therein, wherein the base, the plurality of sidewalls and the top define a containment area therebetween for containing the plurality of electronic components, the at least one damper selectively defining a passage from the base region into the containment area; and a remote heat extraction system in remote communication with the cooling system of said control unit to remove heat produced by said cooling unit;

wherein cooled air is passed from the cooling system to the base of said at least one containment unit, through the at least one damper and into the containment area;

wherein warm air is removed from the containment area through the at least one passageway formed in the top and back to the cooling system;

wherein the warm air removed from the containment area is cooled by the cooling system;

wherein warm air emitted from the cooling system is removed from said control unit and cooled remotely.

2. A containment system according to claim 1 wherein the at least one control panel is in communication with a global communications network.

3. A containment system according to claim 1 wherein the at least one control panel includes a wireless transceiver for wirelessly receiving and transmitting signals relating to conditions within the containment area.

4. A containment system according to claim 1 wherein the damper is adjustable to adjust a volume of cooled air passed from the cooling system and into the containment area.

5. A containment system according to claim 1 wherein said at least one containment unit is adapted to be connected to additional containment units.

6. A containment system according to claim 1 wherein the cooled air is directed towards a rear portion of the containment area of said at least one containment unit.

7. A containment system according to claim 1 wherein the top of said at least one containment unit includes at least one duct in communication with said control unit to direct warm air from the containment area of said at least one containment unit to the cooling system.

8. A containment system according to claim 1 further comprising at least one exhaust fan carried by the top of said at least one containment unit and in communication with the at least one control panel; and wherein the at least one exhaust fan is operational between an activated position and a deactivated position responsive to a signal received from the at least one control panel.

9. A containment system according to claim 8 wherein the at least one exhaust fan is operated in the activated position if the cooling system fails.

10. A containment system according to claim 1 further comprising an environmental control system carried by said control unit and in communication with the at least one control panel; and further comprising at least one environmental sensor carried by the at least one containment unit and in communication with said environmental control system; wherein the environmental control system is operational between a humidifying position and a dehumidifying position to control humidity in the at least one containment unit responsive to a reading received from the at least one environmental sensor.

11. A containment system according to claim 10 further comprising at least one of a humidifier and a dehumidifier to control humidity in the containment area of said at least one containment unit responsive to the reading received from the at least one environmental sensor.

12. A containment system according to claim 1 further comprising at least one backup power source carried by said control unit and in communication with the at least one control panel.

13. A containment system according to claim 1 further comprising at least one temperature sensor carried by said at least one containment unit and in communication with the at least one control panel; wherein the at least one control panel monitors the temperature within the containment area of said at least one containment unit.

14. A containment system according to claim 13 wherein said at least one containment unit comprises a plurality of containment zones; and wherein the at least one control panel individually monitors the temperature in each of the plurality of containment zones.

15. A containment system comprising:

a control unit comprising a cooling system and at least one control panel in communication with the cooling system;

at least one containment unit in communication with said control unit for containing a plurality of electronic components, said at least one containment unit comprising a base including at least one damper, a plurality of sidewalls extending upwardly from the base, and a top overlying the base and having at least one passageway formed therein, wherein the base, the plurality of sidewalls and the top define a containment area therebetween for containing the plurality of electronic components; and a remote heat extraction system in remote communication with the cooling system of said control unit to remove heat produced by said cooling unit;

wherein cooled air is passed from the cooling system to the base of said at least one containment unit, through the at least one damper and into the containment area;

wherein warm air is removed from the containment area through the at least one passageway formed in the top and back to the cooling system;

wherein the warm air removed from the containment area is cooled by the cooling system;

wherein warm air emitted from the cooling system is removed from said control unit and cooled remotely;

wherein said control unit is adapted to be connected to an external power source; and wherein said control unit provides power to said at least one containment unit.

16. A containment system comprising:

at least one control unit comprising a cooling system and at least one control panel in communication with the cooling system; and a plurality of containment units in communication with said cooling unit for containing a plurality of electronic components, wherein a first one of the plurality of containments units is connected to said control unit, and respective additional containment units are connected in series to the first one of the plurality of containment units, each of said plurality of containment units comprising a base including a lower floor member and an upper floor member spaced apart from the lower floor member, the upper floor member carrying at least one damper, the base defining a region between the upper and lower floor members for receiving cooled air from the cooling system, a plurality of sidewalls extending upwardly from the base, a top overlying the base and having at least one passageway formed therein, wherein the base, the plurality of sidewalls and the top define a containment area therebetween for containing the plurality of electronic components, the at least one damper selectively defining a passage from the base region into the containment area;

wherein cooled air is passed from the cooling system to the base of each of said plurality of containment units, through the at least one damper and into the containment area, the at least one damper being adjustable to adjust a volume of cooled air passed into the containment area of each of said plurality of containment units;

wherein warm air is removed from the containment area of each of said plurality of containment units through the at least one passageway formed in the top;

wherein the warm air removed from the containment area of each of the plurality of containment units is cooled by the cooling system;

wherein warm air emitted from the cooling system is removed from said at least one control unit and cooled remotely.

17. A containment system according to claim 16 wherein the control panel is in communication with a global communications network.

18. A containment system according to claim 16 wherein the control panel includes a wireless transceiver for wirelessly receiving and transmitting signals relating to conditions within the containment area.

19. A containment system according to claim 16 wherein the cooled air is directed towards a rear-portion of the containment area of each of said plurality of containment units.

20. A containment system according to claim 16 wherein the top of each of said plurality of containments units includes at least one duct in communication with said control unit to direct warm air from the containment area of each of said plurality of containment units to the cooling system.

21. A containment system according to claim 20 wherein the ducts of each of the plurality of containment units is in communication with one another.

22. A containment system according to claim 16 further comprising at least one exhaust fan carried by the top of each of said plurality of containment units and in, communication with the at least one control panel; and wherein the at least one exhaust fan is operational between an activated position and a deactivated position.

23. A containment system according to claim 22 wherein the at least one exhaust fan is operated in the activated position if the cooling system fails.

24. A containment system according to claim 16 further comprising an environmental control system carried by said control unit and in communication with the at least one control panel; and further comprising at least one environmental sensor carried by each of the plurality of containment units and in communication with said environmental control system; wherein the environmental control system is operational between a humidifying position and a dehumidifying position to control humidity in each of said plurality of containment units responsive to a reading received from the at least one environmental sensor.

25. A containment system according to claim 24 further comprising at least one of a humidifier and a dehumidifier to control humidity in the containment area of each of said plurality of containment units responsive to the reading received from the at least one environmental sensor.

26. A containment system according to claim 16 further comprising at least one temperature sensor carried by each of said plurality of containment units and in communication with the at least one control panel; wherein the at least one control panel monitors the temperature within the containment area of each of said plurality of containment units.

27. A containment system according to claim 26 wherein each of said plurality of containment units comprises a plurality of containment zones; and wherein the at least one control panel individually monitors the temperature in each of the plurality of containment zones.

28. A containment system comprising:

at least one control unit comprising a cooling system and at least one control panel in communication with the cooling system; and a plurality of containment units in communication with said cooling unit for containing a plurality of electronic components, wherein a first one of the plurality of containments units is connected to said control unit, and respective additional containment units are connected in series to the first one of the plurality of containment units, each of said plurality of containment units comprising a base including at least one damper, a plurality of sidewalls extending upwardly from the base, a top overlying the base and having at least one passageway formed therein, wherein the base, the plurality of sidewalls and the top define a containment area therebetween for containing the plurality of electronic components;

wherein cooled air is passed from the cooling system to the base of each of said plurality of containment units, through the at least one damper and into the containment area, the at least one damper being adjustable to adjust a volume of cooled air passed into the containment area of each of said plurality of containment units;

wherein warm air is removed from the containment area of each of said plurality of containment units through the at least one passageway formed in the top;

wherein the warm air removed from the containment area of each of the plurality of containment units is cooled by the cooling system;

wherein warm air emitted from the cooling system is removed from said at least one control unit and cooled remotely;

wherein said control unit is adapted to be connected to an external power source; wherein said control unit provides power to each of said plurality of containment units; and further comprising at least one backup power source carried by said control unit and in communication with the at least one control panel.

29. A method of using a containment system, the method comprising:

connecting a first containment unit to a control unit, the control unit including a cooling system and at least one control panel in communication with the cooling system;

connecting additional containment units to the first containment unit in series so that each additional containment unit is positioned in communication with the control unit, wherein each of the containment units is adapted to contain a plurality of electronic components and comprises a base including at least one damper, a plurality of sidewalls extending upwardly from the base, a top overlying the base and having at least one passageway formed therein, the base including a lower floor member and an upper floor member spaced apart from the lower floor member, the upper floor member carrying the at least one damper, the base defining a region between the upper and lower floor members for receiving cooled air from the cooling system, the base, plurality of sidewalls, and top defining a containment area, the at least one damper selectively defining a passage from the base region into the containment area;

passing cooled air from the cooling system to the base of each of the plurality of containment units through the at least one damper and into the containment area of each of the plurality of containment units;

removing warmed air from the containment area of each of the plurality of containment units through the at least one passageway formed in the top;

cooling the warm air removed from the containment area using the cooling system;

removing warm air emitted from the cooling system; and cooling the warm air emitted from the cooling system remotely.

30. A method according to claim 29 wherein the control unit is adapted to be positioned in communication with each of the electronic components carried by each of the containment units.

31. A method according to claim 29 further comprising wirelessly monitoring conditions within the containment area of each of the containment units.

32. A method according to claim 29 further comprising adjusting the volume of cooled air being passed from the cooling system to the containment area of each of the containment units by moving the at least one damper between an opened position and a closed position.

33. A method according to claim 29 further comprising directing warm air from the containment area of each of the containment units to the cooling system through a duct in the top of the each of the containment units.

34. A method according to claim 29 wherein each of the plurality of containment units comprises at least one exhaust fan carried by the top thereof and in communication with the at least one control panel to be operational between an activated position and a deactivated position; and further comprising operating the at least one exhaust fan in the activated position if the cooling system fails.

35. A method according to claim 29 further comprising operating an environmental control system carried by the control unit and in communication with the at least one control panel between a humidifying position and a dehumidifying position to control humidity in each of the plurality of containment units responsive to a reading received from at least one environmental sensor carried by each of the plurality of containment units and in communication with the environmental control system.

36. A method according to claim 29 further comprising monitoring the temperature within the containment area of each of the plurality of containment units.

37. A containment system according to claim 36 wherein each of the plurality, of containment units comprises a plurality of containment zones; and further comprising individually monitoring the temperature in each of the plurality of containment zones.

38. A method of using a containment system, the method comprising:

connecting a first containment unit to a control unit, the control unit including a cooling system and at least one control panel in communication with the cooling system;

connecting additional containment units to the first containment unit in series so that each additional containment unit is positioned in communication with the control unit, wherein each of the containment units is adapted to contain a plurality of electronic components and comprises a base including at least one damper, a plurality of sidewalls extending upwardly from the base, a top overlying the base and having at least one passageway formed therein, the base, plurality of sidewalls, and top defining a containment area;

connecting the control unit to an external power source providing power to each of the plurality of containment units, and connecting the at least one control panel to a back up power source carried by the control unit;

passing cooled air from the cooling system to the base of each of the plurality of containment units through the at least one damper and into the containment area of each of the plurality of containment units;

removing warmed air from the containment area of each of the plurality of containment units through the at least one passageway formed in the top;

cooling the warm air removed from the containment area using the cooling system;

removing warm air emitted from the cooling system; and cooling the warm air emitted from the cooling system remotely.

* * * * *